United States Patent
Moon et al.

(10) Patent No.: US 6,649,515 B2
(45) Date of Patent: *Nov. 18, 2003

(54) PHOTOIMAGEABLE MATERIAL PATTERNING TECHNIQUES USEFUL IN FABRICATING CONDUCTIVE LINES IN CIRCUIT STRUCTURES

(75) Inventors: Peter K. Moon, Portland, OR (US); Makarem A. Hussein, Beaverton, OR (US); Alan Myers, Portland, OR (US); Charles Recchia, Hillsboro, OR (US); Sam Sivakumar, Hillsboro, OR (US); Angelo Kandas, Hillsboro, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 65 days.

(21) Appl. No.: 09/164,508

(22) Filed: Sep. 30, 1998

(65) Prior Publication Data

US 2001/0021581 A1 Sep. 13, 2001

(51) Int. Cl.⁷ .......................................... H01L 21/4763
(52) U.S. Cl. .................... 438/637; 438/622; 438/624; 438/626; 438/634; 438/638; 438/639; 438/645; 438/637
(58) Field of Search .............................. 438/637, 638, 438/687, 622, 624, 626, 634, 639, 645, 675, 742, 754

(56) References Cited

U.S. PATENT DOCUMENTS

| | | | | |
|---|---|---|---|---|
| 5,422,309 A | | 6/1995 | Zettler et al. | 437/192 |
| 5,677,243 A | * | 10/1997 | Ohsaki | 438/638 |
| 5,702,982 A | * | 12/1997 | Lee et al. | 438/620 |
| 5,705,430 A | * | 1/1998 | Avanzino et al. | 438/618 |
| 5,817,572 A | * | 10/1998 | Chiang et al. | 438/624 |
| 5,989,997 A | * | 11/1999 | Lin et al. | 438/622 |
| 6,017,815 A | * | 1/2000 | Wu | 438/634 |
| 6,033,977 A | * | 3/2000 | Gutsche et al. | 438/618 |
| 6,057,239 A | * | 5/2000 | Wang et al. | 438/689 |

FOREIGN PATENT DOCUMENTS

| | | |
|---|---|---|
| JP | 10-223755 | 8/1998 |
| WO | WO 99/56310 | 11/1999 |
| WO | WO 00/05763 | 2/2000 |

* cited by examiner

*Primary Examiner*—George Fourson
*Assistant Examiner*—Julio J. Maldonado
(74) *Attorney, Agent, or Firm*—Blakely, Sokoloff, Taylor & Zafman LLP

(57) ABSTRACT

A method of forming an interconnection including the steps of depositing a first masking material over a first conductive region of an integrated circuit substrate and depositing a dielectric material over the first masking material. The method also includes forming a via through the dielectric material to expose the first masking material and a second masking material is deposited in a portion of the via. A trench is formed in the dielectric material over a portion of the via and the second masking material is removed from the via. The via is then extended through the first masking material and a conductive material is deposited in the via.

14 Claims, 4 Drawing Sheets

PHOTOIMAGEABLE MATERIAL PATTERNING TECHNIQUES USEFUL IN FABRICATING CONDUCTIVE LINES IN CIRCUIT STRUCTURES

BACKGROUND OF THE INVENTION

1. Field of the Invention

The invention relates to integrated circuit processing and, more particularly, to the patterning of interconnections on an integrated circuit.

2. Background of the Invention

Modern integrated circuits use conductive interconnections to connect the individual devices on a chip or to send or receive signals external to the chip. Popular types of interconnection include aluminum alloy interconnections and copper interconnections.

One significant difference between aluminum and copper interconnections is the rate of oxidation of the metals. Pure aluminum is oxidized to aluminum oxide in the presence of oxygen. However, aluminum has a fairly low diffusion coefficient for oxygen in aluminum oxide, such that as soon as the aluminum oxide is formed, the pure metal (Al) underneath the aluminum oxide layer does not react with oxygen. The reaction between aluminum and oxygen is described as a self-limiting oxidation reaction.

Copper oxidation, on the other hand, is not self limiting. In the presence of oxygen, pure copper will continue to oxidize until substantially all the copper is oxidized to a copper oxide. Thus, once a copper interconnection is formed and patterned, an additional step of adding a passivation layer, typically silicon nitride ($Si_3N_4$), is employed to protect the exposed interconnection material from air or moisture.

One process used to form interconnections, particularly copper interconnections is a damascene process. In a damascene process, a trench is cut in a dielectric and filled with copper to form the interconnection. A via may be in the dielectric beneath the trench with a conductive material in the via to couple the interconnection to underlying integrated circuit devices or underlying interconnections.

A photoresist is typically used over the dielectric to pattern a via or a trench or both in the dielectric for the interconnection. After patterning, the photoresist is removed. The photoresist is typically removed by an oxygen plasma (oxygen ashing). The oxygen used in the oxygen ashing step can react with an underlying copper interconnection and oxidize the interconnection. Accordingly, damascene processes typically employ a thin hard mask or barrier layer of $Si_3N_4$ directly over the copper interconnection to protect the copper from oxidation during oxygen ashing in the formation of a subsequent level interconnection. In general, the $Si_3N_4$ hard mask layer is very thin, for example, roughly 10% of the thickness of the dielectric layer. Thus, when, for example, the via is cut through the oxide by way of an etch, prior art processes require that the etch stops at the underlying $Si_3N_4$. When the trench is then formed in the dielectric above the via, prior art processes require that the etch not remove the $Si_3N_4$ exposed by the via. The ability to etch the via and trench and preserve $Si_3N_4$ requires great selectivity of the etchant such that the thin $Si_3N_4$ layer is not etched away.

What is needed is a process, particularly useful with damascene processes, that does not require unrealistic expectations of etch selectivity.

SUMMARY OF THE INVENTION

A method of forming an interconnection is disclosed. The method includes the steps of depositing a first masking material over a first conductive region of an integrated circuit substrate and depositing a dielectric material over the first masking material. A via is formed through the dielectric material to expose the first masking material and a second masking material is deposited in a portion of the via. A trench is formed in the dielectric material over a portion of the via and the second masking material is removed from the via. The via is then extended through the first masking material and a conductive material is deposited in the via.

DETAILED DESCRIPTION OF THE INVENTION

The invention relates to a method of forming an interconnection. The invention is useful in one embodiment in protecting underlying interconnections during the formation of subsequent or higher level interconnections. The invention also alleviates the burden of unrealistic etch characteristics between a dielectric material and an underlying hard mask incorporated to protect an underlying interconnection such as copper interconnection that might be used as part of a damascene process. The invention alleviates this concern by incorporating a second masking material or a sacrificial material in the via over a hard mask. In this manner, photoresist material used to pattern, for example, a via or trench in a dielectric, may be removed without concern of oxidizing an underlying copper interconnection.

FIGS. 1–10 illustrate a dual damascene process for forming an interconnection over an underlying copper interconnection. A typical integrated circuit may have, for example, four or five interconnection layers or lines stacked one on top of the other each insulated form one and another by dielectric material. FIGS. 1–10 illustrate, for example, the formation of a second interconnection layer or line over and to be electrically connected to a first interconnection layer or line. It is to be appreciated that the method of the invention may be used for each interconnection layer or line.

Figure 1:
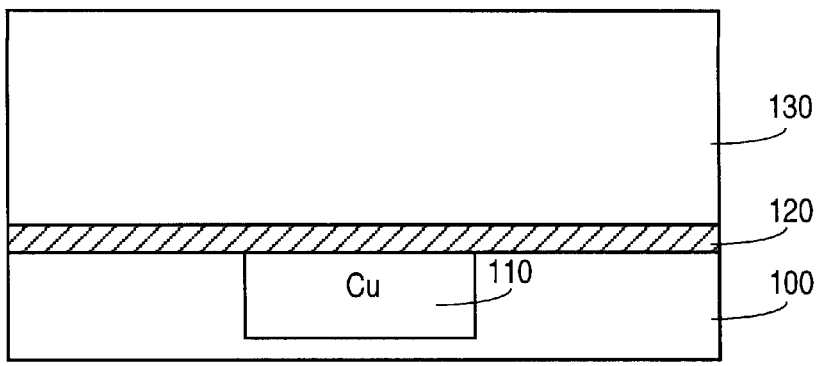
FIG. 1 illustrates a cross-sectional side view of a portion of an integrated circuit substrate showing a copper interconnection insulated by a dielectric material, a hard mask directly overlying the copper interconnection and a dielectric material overlying the hard mask in accordance with an embodiment of the invention.

FIG. 1 illustrates a cross-sectional side view of a portion of an integrated circuit substrate or wafer having a first copper interconnection line 110 formed in dielectric material 100. Copper interconnection line 110 is, for example, coupled to an underlying device or devices formed in and on a semiconductor substrate. The dielectric material is, for example, $SiO_2$ formed by a tetraethyl orthosilicate (TEOS) or plasma enhanced chemical vapor deposition (PECVD) source. In this example, dielectric layer 100 and copper interconnection 110 are planarized.

Overlying the planarized dielectric layer 100/copper interconnection line 110 is first mask layer 120. First mask layer 120 serves, in one aspect, as a mask or barrier to prevent oxidation of copper interconnection line 110. In one embodiment, first mask layer 120 is a layer of silicon nitride ($Si_3N_4$) or silicon oxynitride ($Si_xN_yO_z$) It is to be appreciated that other dielectric materials, including organic polymers, may be suitable for first mask layer 120.

In the example where first mask layer 120 is $Si_3N_4$ or $Si_xN_yO_z$, the material is deposited, for example, by chemical vapor deposition (CVD) to a suitable thickness of approximately 100 nm to mask copper interconnection line 110 during subsequent etching steps. $Si_3N_4$ and $Si_xN_yO_z$ generally have chemical properties, including dielectric constants, that tend to increase the capacitance between interconnection lines and integrated circuits. Accordingly, a very thin amount, i.e., less than or equal to 100 nm, is generally deposited to protect copper interconnection line 110 but not to unacceptably increase the capacitance between interconnection lines. For the remainder of this description, an example of first mask layer 120 of $Si_3N_4$ material will be described.

Overlying first mask layer 120 is dielectric layer 130. Dielectric layer 130 is, for example, a TEOS or PECVD formed $SiO_2$ deposited to a thickness of approximately 1,000 nm. The thickness of dielectric layer 130 will depend, in part, on size characteristics and scaling considerations for the device. Once dielectric layer 130 is deposited and formed, the material is planarized for example with a chemical-mechanical polish.

Figure 2:
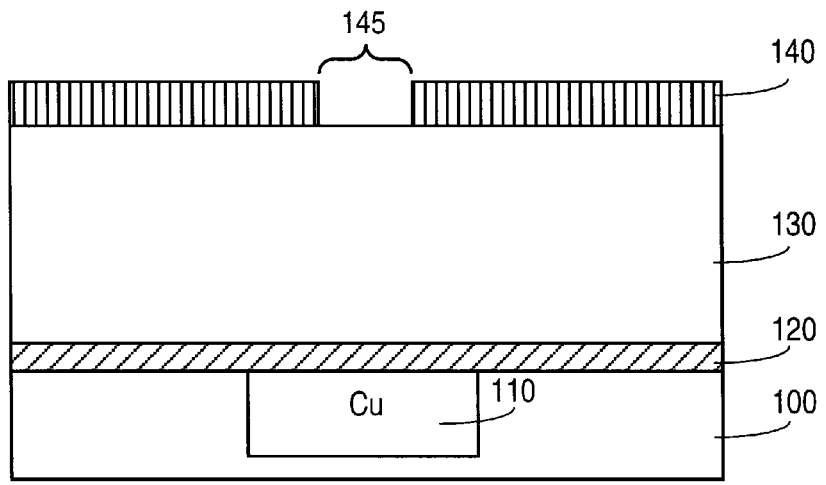
FIG. 2 shows the substrate of FIG. 1 after the further processing step of patterning a photoresist mask over the dielectric material in accordance with an embodiment of the invention.

Next, as shown in FIG. 2, via pattern or second mask layer 140 is patterned over dielectric layer 130. Second mask layer 140 is, for example, a photo-imageable material such as a photoresist. A positive photoresist, for example, second mask layer 140 is spun onto the surface of dielectric layer 130 generally across the wafer. A mask or reticle is then used to expose a portion of the photoresist to a light source. In this case, the reticle or mask defines an area for via or opening 145 over dielectric layer 130. Once the photoresist material of second mask layer 140 is exposed to light, the exposed material is removed in a conventional manner such as for example, by a developer, and the substrate is baked to harden the remaining photoresist. The process leaves second mask layer 140 of photoresist having an opening 145 over dielectric layer 130.

Figure 3:
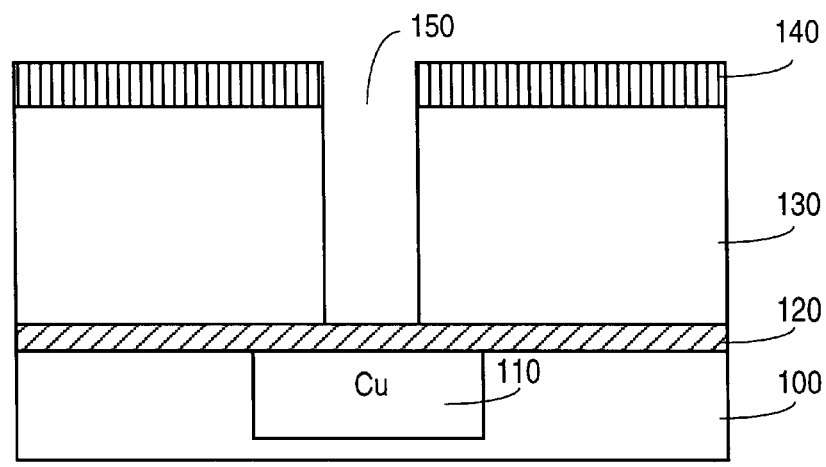
FIG. 3 shows the substrate of FIG. 1 after the further processing step of opening a via through the dielectric material and stopping at the hard mask layer in accordance with an embodiment of the invention.

As shown in FIG. 3, once second mask layer 140 is patterned, an etchant is used to open via 150 through dielectric layer 130. An etchant is chosen that does not substantially react or disrupt underlying first mask layer 120. In the case of a $SiO_2$ dielectric layer 130, for example, overlying a $Si_3N_4$ masking layer 120, a suitable etchant to selectively etch $SiO_2$ without substantially etching $Si_3N_4$ is, for example, a $C_4F_8$ etch chemistry. One objective of the via etch is to etch the via through dielectric 130 and stop the etching prior to etching through $Si_3N_4$ first mask layer 120. It is to be appreciated that some of the $Si_3N_4$ material of first mask layer 120 may be etched away during the via etch, however, the etch should be monitored so that some $Si_3N_4$ material remains overlying and protecting copper interconnection line 110.

Figure 4:
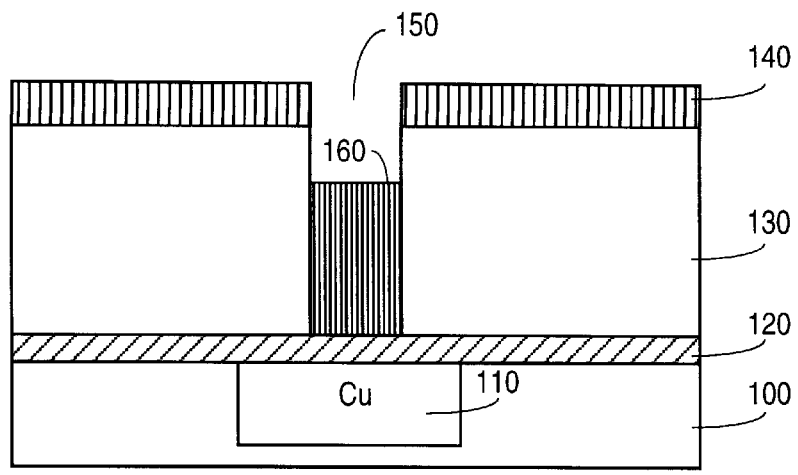
FIG. 4 shows the substrate of FIG. 1 after the further processing step of depositing a second masking or sacrificial material in a portion of the via in accordance with an embodiment of the invention.

Next, as shown in FIG. 4, sacrificial material 160 is deposited in a portion of via 150. One objective of sacrificial material 160 is to protect underlying first mask layer 120 such as $Si_3N_4$ during a subsequent trench etch. Suitable materials for sacrificial material 160 include, but are not limited to, both photo-imageable materials such as photoresist, and non-photo-imageable materials such as polymers (e.g., polyaryl ether) or spin-on glass (SOG). One advantage of using a photo-imageable material like a photoresist is that sacrificial material 160 may be removed during a photoresist clean. An advantage of a spin-coated material is that the material may be spun in a liquid-like fashion into via 150 with very little material being deposited over the top surface of the substrate. Any small amount that is deposited over dielectric material 130 may be cleaned as desired with a brief plasma etch or polish.

Sacrificial material 160 does not need to completely fill via 150. Instead, only enough sacrificial material 160 is needed to preserve underlying first mask layer 120 during a trench etch to form a trench pattern for a subsequent copper interconnection line. Thus, in the case where via 150 is substantially filled with sacrificial material 160, sacrificial material 160 should be chosen to have etch-rate characteristics similar to dielectric layer 130. In this manner, a subsequent trench etch over via 150 will not be impeded by sacrificial material 160 as the etch will simultaneously remove sacrificial material 160 in via 150 to form a trench.

Figure 5:
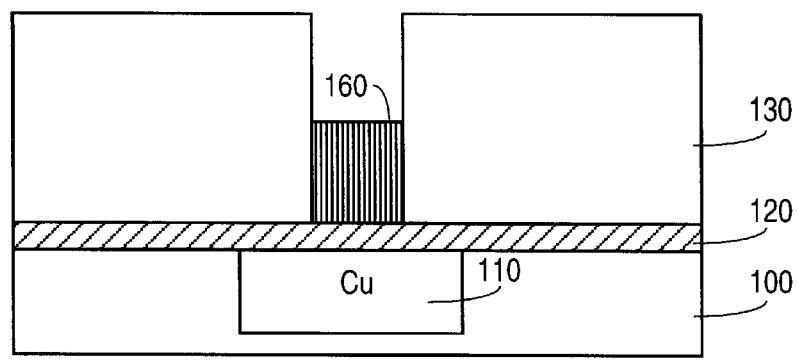
FIG. 5 shows the substrate of FIG. 1 after the further processing step of removing the photoresist mask for the via opening in accordance with an embodiment of the invention.

Once sacrificial material 160 is formed in a portion of via 150, second mask layer 140 is removed. In the embodiment where second mask layer 140 is a photoresist, the mask is removed in a conventional manner, such as for example, by way of an oxygen plasma (e.g., oxygen ashing). In the case where sacrificial material 160 is also photoresist, it is to be appreciated that some of sacrificial material 160 will also be removed during the oxygen ashing. Accordingly, via 150 should have sufficient photoresist as sacrificial material 160 that a subsequent oxygen ashing to remove the via photoresist pattern overlying dielectric layer 130 does not remove all of sacrificial material 160 from via 150. It is also to be appreciated that, to avoid removing all of sacrificial material 160, sacrificial material 160 may be deposited in via 150 after second mask layer 140 is removed. In either case, FIG. 5 shows the substrate having via 150 formed through dielectric layer 130 and a portion of via 150 filled with sacrificial material 160 to protect the underlying first mask layer 120 (e.g., $Si_3N_4$ mask).

Figure 6:
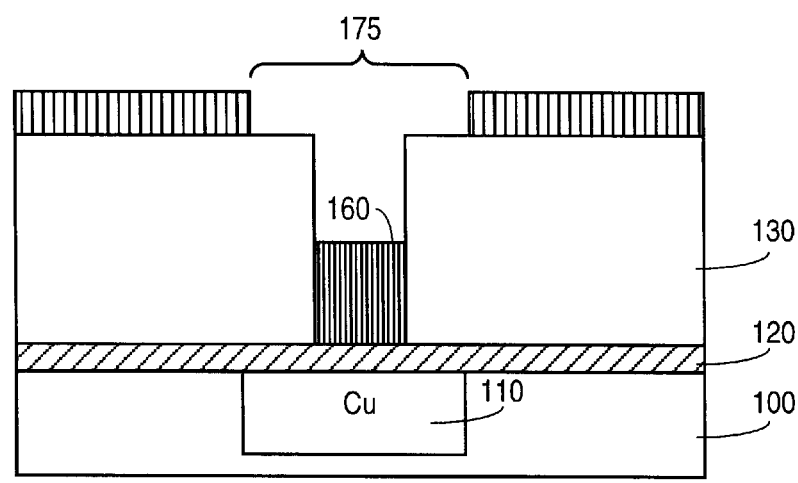
FIG. 6 shows the substrate of FIG. 1 after the further processing step of patterning a second photoresist layer for a trench opening in the dielectric material in accordance with an embodiment of the invention.
Figure 7:
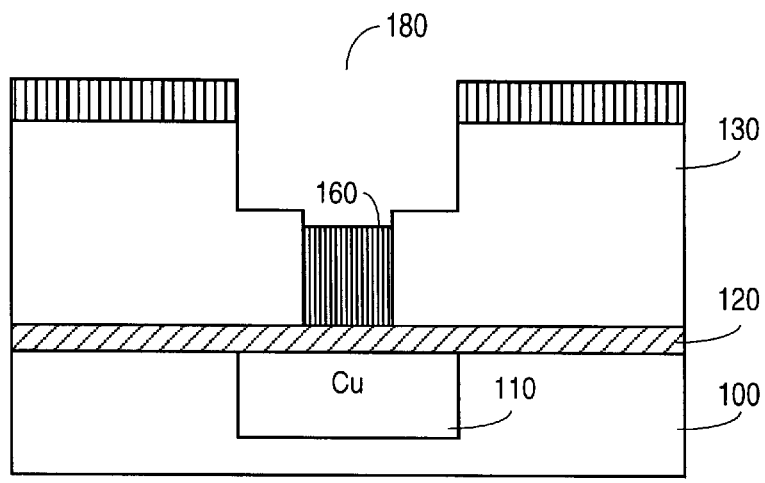
FIG. 7 shows the substrate of FIG. 1 after the further processing step of opening a trench in the dielectric material in accordance with an embodiment of the invention.

Next, as shown in FIG. 6, second pattern mask 170 is patterned over dielectric layer 130 to pattern a trench in oxide 130. Thus, FIG. 6 shows trench patterning or third mask layer 170 patterned over dielectric layer 130 in such a way as to leave an area 175 exposed for trench patterning. A suitable third mask layer 170 is, for example, a photoresist formed as described above with respect to second mask layer 140. It is to be appreciated, however, that other masking layers, including, for example, a hard mask of $Si_3N_4$ or other dielectric may be employed.

Once third mask layer 170 is formed, trench 180 is formed in dielectric layer 130. Trench 180 is patterned to a depth suitable for a conductive interconnection. In one embodiment, for example, trench 180 has a depth of approximately 500 nm. Again, the precise dimensions of trench 180 will vary depending on the scale of the integrated circuit to be formed. In the case of dielectric layer 130 of $SiO_2$, a suitable etchant to form trench 180 is, for example $CHF_3/O_2$ etch chemistry.

By incorporating sacrificial material 160 in via 150, underlying first mask layer 120 is protected during the trench etch described above. If concerns of removing underlying first mask layer 120 (such as, for example, $Si_3N_4$ layer) are removed, a suitable etchant may be chosen for the trench etch without concern for selectivity between dielectric layer 130 and first mask layer 120. Accordingly, a suitable etchant can be chosen based on other parameters, for example, the etch rate, the verticalness of the etch, etc.

Figure 8:
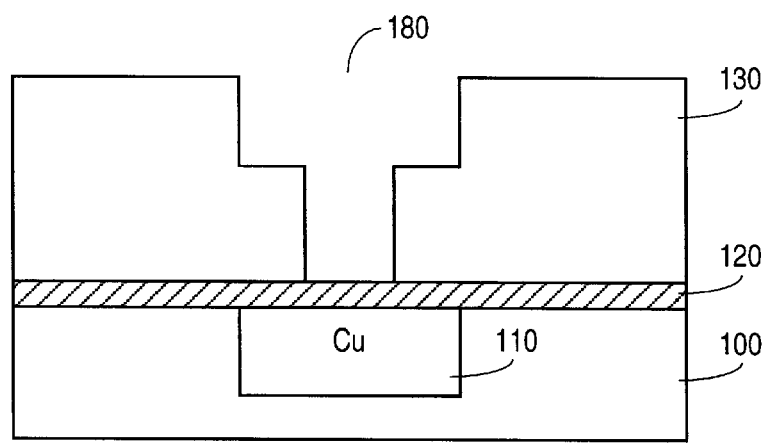
FIG. 8 shows the substrate of FIG. 1 after the further processing step of removing the photoresist material patterned for the trench and the second mask or sacrificial material in accordance with an embodiment of the invention.

FIG. 8 shows the substrate after the subsequent processing step of removing third mask layer 170. FIG. 8 also shows the substrate after the step of removing sacrificial material 160 and exposing underlying first mask layer 120.

By incorporating sacrificial material 160 in via 150, the concerns of the prior art of removing underlying first mask layer 120 during trench etch are alleviated. Accordingly, sacrificial material 160 is selected, in one embodiment, to have a low etch rate during trench etch. Sacrificial material 160 is also chosen, in one embodiment, to have a high etch or removal rate during trench patterning or third mask layer removal. One choice of sacrificial material 160 with a suitable etch rate during third mask layer 170 removal is photoresist. In this manner, when third mask layer 170 is also photoresist, both third mask layer 170 and sacrificial material 160 may be removed by, for example, an oxygen ashing. Since first mask layer 120 overlies copper interconnection line in via 150, copper interconnection line 110 is protected from oxidation by the presence of oxygen during the oxygen ashing step.

Figure 9:
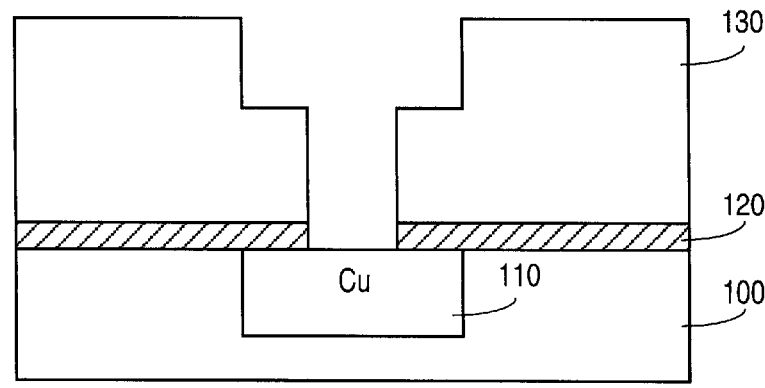
FIG. 9 shows the substrate of FIG. 1 after the further processing step of extending the via through the hard mask material to expose the copper interconnection in accordance with an embodiment of the invention.

Once sacrificial material 160 is removed from via 150, a subsequent etch may be used to remove the exposed $Si_3N_4$ material of first mask layer 120. Removing exposed first mask layer 120 in via 150 exposes underlying copper interconnection 110 as shown in FIG. 9. A suitable etchant to remove first mask layer 120 of $Si_3N_4$ is, for example, a $CF_4/O_2$ etch chemistry.

Figure 10:
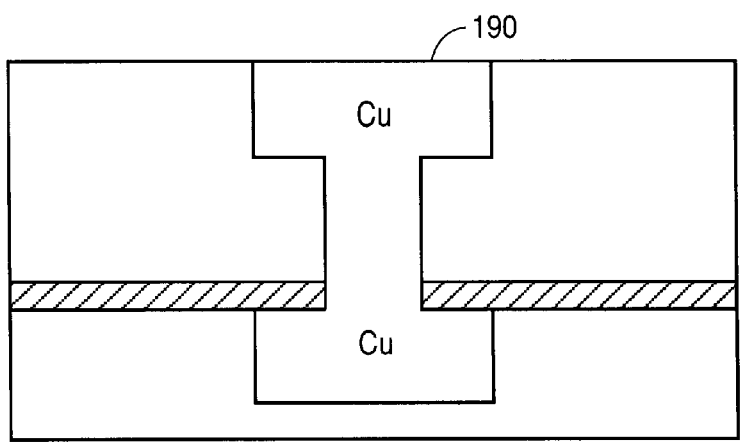
FIG. 10 shows the substrate of FIG. 1 after the further processing step of depositing a copper material in the trench and via openings and planarizing the copper with the dielectric material in accordance with an embodiment of the invention.

After exposing underlying copper interconnection 110, FIG. 10 shows the substrate after the subsequent processing step of depositing copper material 190 in trench 180 and via 150. The deposition precedes via a conventional damascene process. Once copper material 190 is deposited in via 150 and trench 180, the substrate may be planarized according to conventional damascene processing techniques to form a subsequent level interconnection. The process steps described above with respect to FIGS. 1–10 may then be repeated for a subsequent interconnection layer.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of forming an interconnection comprising:
    depositing a masking material over a first conductive region of an integrated circuit substrate;
    depositing a dielectric material over the masking material;
    forming a via through the dielectric material to expose the masking material;
    depositing a first photoimageable material in a portion of the via over the exposed masking material such that the via is partially filled with the first photoimageable material; after depositing said first photoimageable material depositing a second photoimageable material and patterning said second photoimageable material over the dielectric material defining an area for a trench
    after patterning the second photoimageable material, forming a trench in the dielectric material over a portion of the via;
    removing the first photoimageable material from the via;
    extending the via through the masking material; and
    depositing a conductive material in the via.

2. The method of claim 1, wherein the first conductive region is an interconnection.

3. The method of claim 1, wherein forming a via through the dielectric material comprises an etch and wherein the etch characteristics of the dielectric material are different than the etch characteristics of the first masking material for an etchant.

4. The method of claim 1, wherein the first masking material is one of silicon nitride and silicon oxynitride.

5. The method of claim 1, wherein the masking material is a first masking material and forming a via comprises patterning a second masking material on the dielectric material with an opening and forming the via through the opening in the second masking material, and the method further comprises:
    after depositing the first photoimageable material in the via, removing the second masking material.

6. In an integrated circuit including a first interconnection coupled to a transistor, a method of forming a second interconnection comprising:
    depositing a masking material over the first interconnection;
    depositing a dielectric material over the masking material;
    forming a via through the dielectric material to expose the masking material;
    depositing a first photoimageable material in a portion of the via over the exposed masking material such that the via is partially filled with the first photoimageable material; after depositing said first photoimageable material depositing a second photoimageable material and patterning said second photoimageable material over the dielectric material defining an area for a trench
    after patterning the second photoimageable material, forming a trench in the dielectric material over a portion of the via;
    removing the photoimageable material from the via;
    extending the via through the masking material; and
    depositing a conductive material in the via.

7. The method of claim 6, wherein the first masking material is one of silicon nitride and silicon oxynitride.

8. The method of claim 6, wherein forming a via through the dielectric material comprises an etch and wherein the etch characteristics of the dielectric material are different than the etch characteristics of the masking material for an etchant.

9. The method of claim 6, wherein the masking material is a first masking material and forming a via comprises patterning a second masking material on the dielectric material with an opening and forming the via through the opening in the second masking material, and the method further comprisessing:

after depositing the first photoimageable material in the via, removing the second masking material.

10. A damascene method comprising:

depositing a masking material over a conductive interconnection of an integrated circuit substrate;

depositing a dielectric material over the masking material;

forming a via through the dielectric material to expose the masking material;

depositing a first photoimageable material in a portion of the via over the exposed masking material such that the via is partially filled with the first photoimageable material;

patterning a second photoimageable material over the dielectric material defining an area for a trench;

after patterning the second photoimageable material, forming a trench in the dielectric material over a portion of the via;

removing the first photoimageable material from the via; extending the via through the masking material; and depositing a conductive material in the via, wherein the first photoimageable material and the second photoimageable material have different compositions.

11. The method of claim 10, wherein the conductive material is copper.

12. The method of claim 10, wherein forming a via through the dielectric material comprises an etch and wherein the etch characteristics of the dielectric material are different than the etch characteristics of the first marking material for an etchant.

13. The method of claim 10, wherein the first masking material is one of silicon nitride and silicon oxynitride.

14. The method of claim 10, wherein the masking material is a first masking material and forming a via comprises patterning a second masking material on the dielectric material with an opening and forming the via through the opening in the second masking material, and the method further comprises:

after depositing the first photoimageable material in the via, removing the second masking material.

* * * * *